(12) United States Patent
Kadoguchi et al.

(10) Patent No.: US 9,543,264 B2
(45) Date of Patent: Jan. 10, 2017

(54) SEMICONDUCTOR DEVICE AND METHOD OF MANUFACTURING SEMICONDUCTOR DEVICE

(71) Applicant: TOYOTA JIDOSHA KABUSHIKI KAISHA, Toyota-shi, Aichi-ken (JP)

(72) Inventors: Takuya Kadoguchi, Toyota (JP); Hiroshi Yanagimoto, Miyoshi (JP); Motoki Hiraoka, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/925,267

(22) Filed: Oct. 28, 2015

(65) Prior Publication Data

US 2016/0126204 A1 May 5, 2016

(30) Foreign Application Priority Data

Oct. 30, 2014 (JP) .................................. 2014-221353

(51) Int. Cl.
*H01L 21/48* (2006.01)
*H01L 23/00* (2006.01)
(Continued)

(52) U.S. Cl.
CPC ............ *H01L 24/16* (2013.01); *B23K 35/262* (2013.01); *C22C 13/00* (2013.01); *H01L 24/32* (2013.01);
(Continued)

(58) Field of Classification Search
CPC .............. H01L 2224/29147; H01L 23/49513; H01L 2224/83801; H01L 2224/29111; H01L 2924/01029; H01L 2924/0105; H01L 2224/48091; H01L 2924/29311; H01L 2224/29247
See application file for complete search history.

(56) References Cited

U.S. PATENT DOCUMENTS

| 2004/0007384 A1 | 1/2004 | Soga et al. |
| 2007/0057021 A1 | 3/2007 | Ikeda et al. |

(Continued)

FOREIGN PATENT DOCUMENTS

| EP | 1760783 A2 | 3/2007 |
| EP | 2276063 A2 | 1/2011 |

(Continued)

OTHER PUBLICATIONS

Ha et al; "Effect of supersaturation of Cu on reaction and intermetallic compund formation between Sn—Cu solder and thin film metallization;" J. Mater. Res.; vol. 18; No. 9; Sep. 2003; XP002453621; pp. 2109-2114.

(Continued)

*Primary Examiner* — Jasmine Clark
(74) *Attorney, Agent, or Firm* — Oliff PLC

(57) ABSTRACT

A method of manufacturing a semiconductor device includes: arranging a solder material containing at least tin, between a semiconductor element and a joined member provided with a nickel layer and a copper layer, such that the solder material is in contact with the copper layer, the nickel layer being provided on a surface of the joined member, and the copper layer being provided on at least a portion of a surface of the nickel layer; and melting and solidifying the solder material to form $Cu_6Sn_5$ on the surface of the nickel layer using tin of the solder material and the copper layer.

7 Claims, 6 Drawing Sheets

(51) Int. Cl.
*C22C 9/00* (2006.01)
*C22C 12/00* (2006.01)
*B23K 35/26* (2006.01)
*C22C 13/00* (2006.01)

(52) U.S. Cl.
CPC ............ *H01L 24/81* (2013.01); *H01L 24/83* (2013.01); *H01L 24/05* (2013.01); *H01L 24/29* (2013.01); *H01L 24/33* (2013.01); *H01L 2224/04026* (2013.01); *H01L 2224/05155* (2013.01); *H01L 2224/05647* (2013.01); *H01L 2224/16245* (2013.01); *H01L 2224/16502* (2013.01); *H01L 2224/291* (2013.01); *H01L 2224/29111* (2013.01); *H01L 2224/32245* (2013.01); *H01L 2224/32503* (2013.01); *H01L 2224/33181* (2013.01); *H01L 2224/81805* (2013.01); *H01L 2224/8381* (2013.01); *H01L 2224/83447* (2013.01); *H01L 2224/83815* (2013.01); *H01L 2924/014* (2013.01); *H01L 2924/181* (2013.01)

(56) References Cited

U.S. PATENT DOCUMENTS

| | | |
|---|---|---|
| 2009/0134501 A1 | 5/2009 | Ganitzer et al. |
| 2009/0236725 A1 | 9/2009 | Hirano et al. |
| 2009/0243089 A1 | 10/2009 | Hohlfeld et al. |
| 2011/0006415 A1 | 1/2011 | Bachman et al. |
| 2011/0042815 A1 | 2/2011 | Ikeda et al. |
| 2012/0208323 A1* | 8/2012 | Heinrich ................ H01L 24/83 438/123 |
| 2016/0126207 A1 | 5/2016 | Kadoguchi |

FOREIGN PATENT DOCUMENTS

| | | |
|---|---|---|
| JP | 2005-340275 A | 12/2005 |
| JP | 2007-067158 A | 3/2007 |
| JP | 2011-044624 A | 3/2011 |
| JP | 2011-233879 A | 11/2011 |
| JP | 2013-197427 A | 9/2013 |
| JP | 5369682 B2 | 12/2013 |
| JP | 5517694 B2 | 6/2014 |
| JP | 2016-092063 A | 5/2016 |
| KR | 20110006615 A | 1/2011 |

OTHER PUBLICATIONS

Laurila et al; "Interfacial reactions between lead-free solders and common base materials;" Materials Science and Engineering; vol. 49; Mar. 2005; pp. 1-60.

* cited by examiner

← 4a(Sn0.7Cu)

← 4b(Cu$_6$Sn$_6$)

← 2a(NiP)

← 2b(Cu)

← 4a(Sn0.7Cu)

← 4b(Cu$_6$Sn$_6$)

← 2a(NiP)

← 2b(Cu)

SEMICONDUCTOR DEVICE AND METHOD OF MANUFACTURING SEMICONDUCTOR DEVICE

INCORPORATION BY REFERENCE

The disclosure of Japanese Patent Application No. 2014-221353 filed on Oct. 30, 2014 including the specification, drawings and abstract is incorporated herein by reference in its entirety.

BACKGROUND OF THE INVENTION

1. Field of the Invention

The present invention relates to a semiconductor device and a method of manufacturing a semiconductor device. In particular, the invention relates to a semiconductor device in which an electrode of a semiconductor element is joined to a joined member.

2. Description of Related Art

Japanese Patent Application Publication No. 2007-67158 (JP 2007-67158 A) discloses a semiconductor device in which a semiconductor element is joined to a joined member. In JP 2007-67158 A, the semiconductor element is joined to the joined member, on which a nickel layer is formed, through a Sn—Cu solder (mixed alloy solder of tin and copper). The proportion of Cu contained in the Sn—Cu solder is adjusted to be 3.0 wt % to 7.0 wt % (percent by weight). That is, the semiconductor element is joined to the joined member through a Sn-3.0 to 7.0Cu solder. JP 2007-67158 A describes that, when molten solder is solidified, a $Cu_6Sn_5$ compound is formed on a surface of the nickel layer. The $Cu_6Sn_5$ compound prevents mutual diffusion between nickel of the nickel layer and Sn of the Sn—Cu solder.

As described in JP 2007-67158 A, when a Sn—Cu solder containing lower than 0.9 wt % of Cu is used, theoretically, a $Cu_6Sn_5$ compound is not formed. Therefore, JP 2007-67158 A describes that a semiconductor element is joined to a joined member through a Sn—Cu solder containing 0.9 wt % or higher of Cu. In the description, as described above, it is more preferable that the proportion of Cu in the Sn—Cu solder is adjusted to be 3.0 wt % to 7.0 wt %.

SUMMARY OF THE INVENTION

However, when the proportion of Cu constituting a Sn—Cu solder increases, the melting point (or liquidus temperature) of the solder increases. For example, in the case of Sn-3.0Cu solder, the liquidus temperature is higher than 310° C. When a solder having a high melting point (liquidus temperature) is used, it is necessary that the heat resistance of a semiconductor element is improved to prevent the semiconductor element from being damaged. Therefore, a method of manufacturing a semiconductor device is provided which is capable of suppressing the melting point (or liquidus temperature) of a solder to be low while achieving the formation of a $Cu_6Sn_5$ compound on a surface of a joined member. Further, a semiconductor device is also provided.

According to a first aspect of the invention, there is provided a method of manufacturing a semiconductor device including: arranging a solder material containing at least tin, between a semiconductor element and a joined member provided with a nickel layer and a copper layer, such that the solder material is in contact with the copper layer, the nickel layer being provided on a surface of the joined member, and the copper layer being provided on at least a portion of a surface of the nickel layer; and melting and solidifying the solder material to form $Cu_6Sn_5$ on the surface of the nickel layer using tin of the solder material and the copper layer.

"Solder material" described in this specification refers to a material before melting and, when melted, is used to join a semiconductor element and a joined member to each other. On the other hand, a portion of the joining layer through which the semiconductor element and the joined member are joined to each other, which is a material after joining the semiconductor element and the joined member to each other (that is, after the solidification of the solder material), is called "solder portion" and is distinguished from the solder material. "Copper in contact with the solder material" is not limited to copper in the copper layer provided on the surface of the nickel layer. "Copper in contact with the solder material" includes copper of a region other than the surface of the nickel layer (for example, a surface of an electrode of the semiconductor element) as long as it comes into contact with the solder material during the arrangement step. In addition, "$Cu_6Sn_5$ portion (or $Cu_6Sn_5$)" includes a compound in which a part of Cu is substituted with Ni. That is, "$Cu_6Sn_5$ portion (or $Cu_6Sn_5$)" includes $(Cu,Ni)_6Sn_5$. For example, when a Sn—Cu solder to which Ni is added is used, Ni forms a solid solution in $Cu_6Sn_5$ to form $(Cu,Ni)_6Sn_5$. $Cu_6Sn_5$ and $(Cu,Ni)_6Sn_5$ exhibit substantially the same function. The joined member is not limited to a member that is directly joined to the semiconductor element, and includes a member (second member) that is joined to a member (first member) joined to the semiconductor element. That is, the joined member described in this specification refers to a member that is directly or indirectly joined to the semiconductor element. When the first member and the second member are joined to each other using the above-described method, practically, the solder material is arranged between the first member and the second member. The arrangement step of arranging the solder material between the semiconductor element and the joined member includes arranging the solder material between the first member, which is joined to the semiconductor element, and the second member.

In the above-described manufacturing method, the solder material is melted and solidified in a state where the solder material and the copper layer are in contact with each other. The copper layer in contact with the solder material may be a Cu component for forming the $Cu_6Sn_5$ portion when the solder material is melted and then solidified to join the semiconductor element to the joined member. Therefore, even when the proportion of Cu contained in the solder material is low, the $Cu_6Sn_5$ portion can be obtained. By suppressing the proportion of Cu contained in the solder material to be low, the melting point (or liquidus temperature) of the solder material can be reduced. The $Cu_6Sn_5$ portion is deposited on the surface of the nickel layer. According to the above-described manufacturing method, even when a solder material (having a low copper content and a low melting point or liquidus temperature) which is theoretically incapable of forming $Cu_6Sn_5$ is used, the $Cu_6Sn_5$ portion can be formed on the surface of the nickel layer. That is, a solder material having a low melting point (or liquidus temperature) can be used while achieving the formation of the $Cu_6Sn_5$ compound on the surface of the joined member. In addition, in the above-described manufacturing method, when the semiconductor element and the joined member are joined to each other, exposure of the semiconductor element to a high temperature can be suppressed. Therefore, high heat resistance is not required for the semiconductor element.

According to a second aspect of the invention, there is provided a semiconductor device including: a semiconductor element; a joined member on which a nickel layer is provided; and a joining layer through which the joined member is joined to the semiconductor element, in which the joining layer includes a solder portion and a $Cu_6Sn_5$ portion, the solder portion containing at least tin, and the $Cu_6Sn_5$ portion being provided between the nickel layer and the solder portion, the $Cu_6Sn_5$ portion is in contact with a portion of a surface of the nickel layer and is not in contact with other portions of the surface of the nickel layer, and a proportion of copper contained in the joining layer is 2.0 wt % or higher.

According to a third aspect of the invention, there is provided a semiconductor device including: a semiconductor element; a joined member on which a nickel layer is provided; and a joining layer through which the joined member is joined to the semiconductor element, in which the joining layer includes a solder portion and a $Cu_6Sn_5$ portion, the solder portion containing tin and copper, and the $Cu_6Sn_5$ portion being provided between the nickel layer and the solder portion, and the weight of copper contained in the solder portion is lower than 0.9 wt % with respect to the weight of the solder portion.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
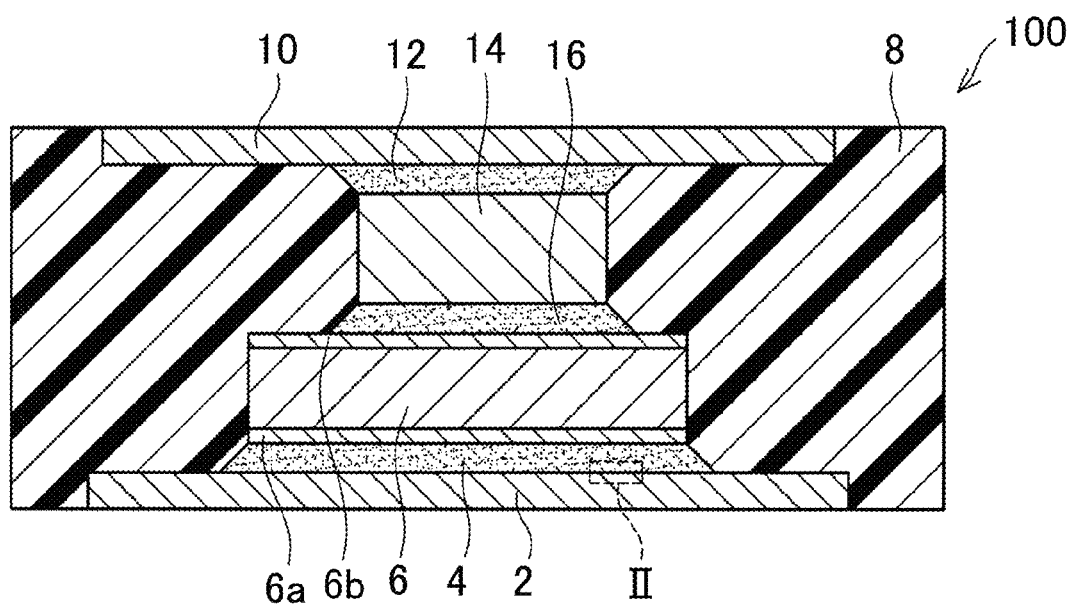
FIG. 1 is a schematic diagram showing a semiconductor device.

Referring to FIG. 1, a semiconductor device 100 will be described. In the semiconductor device 100, a semiconductor element 6 is arranged between two metal plates 2, 10, and the components are formed by molding a resin 8. The metal plates 2, 10 correspond to electrode plates of the semiconductor device 100. In addition, the metal plates 2, 10 correspond to heat sinks that dissipate heat of the semiconductor element 6 to the outside of the semiconductor device 100. One surface of each of the metal plates 2, 10 is exposed from the surface of the resin 8. In FIG. 1, terminals, bonding wires, and the like connected to the semiconductor element 6 are not shown.

A joining layer 4 is provided between the semiconductor element 6 and the metal plate 2. More specifically, an electrode 6a provided on the metal plate 2 side (hereinafter, referred to as "back surface") of the semiconductor element 6 is soldered to the metal plate 2. In addition, an electrode 6b provided on the metal plate 10 side (hereinafter, referred to as "front surface") of the semiconductor element 6 is soldered to a back surface of a metal spacer 14. A front surface of the spacer 14 is soldered to a back surface of the metal plate 10. That is, the semiconductor element 6 is joined to the metal plate 2 through the joining layer 4, the semiconductor element 6 is joined to the spacer 14 through a joining layer 16, and the spacer 14 is joined to the metal plate 10 through a joining layer 12. It can be said that the metal plate 10 is indirectly joined to the semiconductor element 6. The metal plates 2, 10 and the spacer 14 are examples of the joined member.

Surfaces of the semiconductor element 6, the metal plates 2, 10, the spacer 14, and the joining layers 4, 12, 16 are coated with a primer (not shown). By using the primer, the joining properties between the resin 8; and the semiconductor element 6, the metal plates 2, 10, the spacer 14, and the joining layers 4, 12, and 16 are improved. A thermosetting polyimide resin is used as the primer, and an epoxy resin is used as the resin 8.

Figure 2:
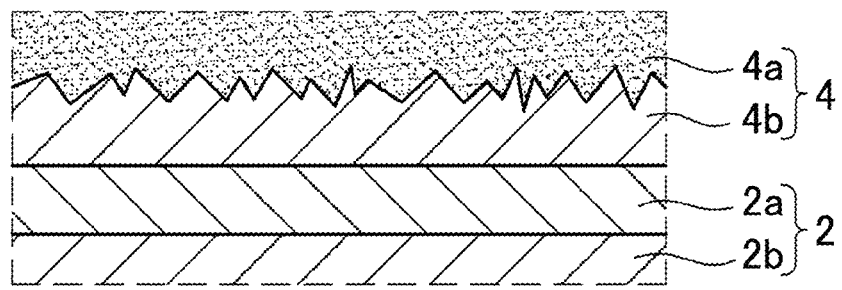
FIG. 2 is an enlarged view showing a portion of FIG. 1 surrounded by broken lines.
Figure 3:
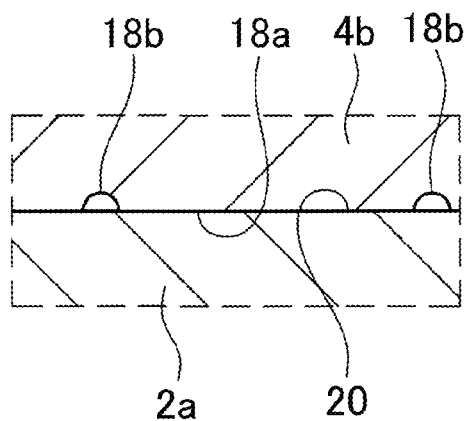
FIG. 3 is a diagram showing characteristics of a joint interface between a nickel layer and a $Cu_6Sn_5$ portion.

FIG. 2 schematically shows an interface between the metal plate 2 and the joining layer 4. As shown in FIG. 2, the metal plate 2 includes a Cu plate 2b and a Ni layer 2a. The Ni layer 2a covers the surface of the Cu plate 2b. The thickness of the Ni layer 2a is adjusted to be 2 μm to 20 μm. The joining layer 4 includes a solder portion 4a and a $Cu_6Sn_5$ portion 4b. The $Cu_6Sn_5$ portion 4b separates the solder portion 4a and the Ni layer 2a from each other. The $Cu_6Sn_5$ portion 4b prevents contact between the solder portion 4a and the Ni layer 2a. As shown in FIG. 3, the $Cu_6Sn_5$ portion 4b includes: a contact portion 18a that is in contact with a surface 20 of the Ni layer 2a; and a non-contact portion 18b that is not in contact with the surface 20 of the Ni layer 2a. A space between the surface 20 and the non-contact portion 18b is hollow. In other words, voids are present in a part of the space between the $Cu_6Sn_5$ portion 4b and the Ni layer 2a. A Cu portion and a Ni film which covers a surface of the Cu portion are also provided on a surface of the electrode 6a. Therefore, an interface between the electrode 6a and the joining layer 4 also has the same configuration as the interface between the metal plate 2 and the joining layer 4.

Figure 4:
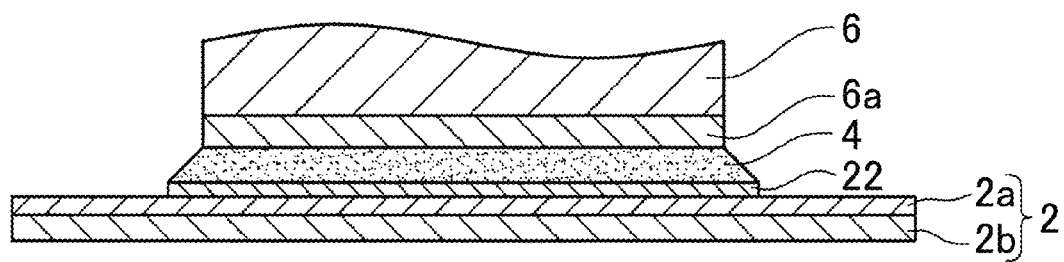
FIG. 4 is a diagram showing a method of manufacturing a semiconductor device.

Referring to FIG. 4, a step of joining the semiconductor element 6 to the metal plate 2 will be described. First, the Ni layer 2a is formed on the surface of the Cu plate 2b. As a result, the metal plate 2 on which the Ni layer 2a is provided is obtained. Next, a Cu layer 22 is formed at a predetermined position on a surface of the Ni layer 2a. Next, a solder material 4 is arranged between the back surface electrode 6a of the semiconductor element 6 and the Cu layer 22 (arrangement step). At this time, the solder material 4 is arranged so as to be in contact with the Cu layer 22. The solder material is arranged on the entire region of the surface of the Cu layer 22. The solder material 4 is Sn-0.7Cu solder, and the thickness thereof is adjusted to be 0.15 mm. The thickness of the Cu layer 22 is adjusted to be 1.4 μm, and the weight of the Cu layer 22 is 1.3 wt % with respect to the sum of the weight of the solder material 4 and the weight of the Cu layer 22 (total weight of the joining materials). That is, the sum of the weight of copper contained in the solder material 4 and the weight of the Cu layer 22 (total weight of copper) is 2.0 wt % with respect to the total weight of the joining materials.

A Cu layer may be formed on the entire region of the surface of the Ni layer 2a, and the solder material 4 may be arranged at a predetermined position on a surface of the Cu layer (at a portion of the surface of the Cu layer). In this case, when the thickness of the Cu layer is adjusted to be 1.4 μm, the weight of the Cu layer is greater than that in the above-described embodiment in which the Cu layer is provided at the predetermined position. However, the total weight of copper refers to the sum of the weight of copper contained in the solder material 4 and the weight of the Cu layer in a region in contact with the solder material 4. In addition, the total weight of the joining materials refers to the sum of the weight of the solder material 4 and the weight of the Cu layer in a region in contact with the solder material 4. Therefore, even when a Cu layer is formed on the entire region of the surface of the Ni layer 2a, and when the solder material 4 is arranged at a predetermined position on a surface of the Cu layer, the total weight of copper is adjusted to be 1.3 wt % with respect to the total weight of the joining materials by adjusting the thickness of the Sn-0.7Cu solder (solder material) to be 0.15 mm and adjusting the thickness of the Cu layer to be 1.4 μm. That is, the weight of the Cu layer in a region not in contact with the solder material 4 is not included in the total weight of the joining materials and the total weight of copper.

Next, a heat treatment is performed on the solder material 4 at 230° C., and the solder material 4 is melted and solidified (heat treatment step). When the solder material 4 is solidified, Cu of the Cu layer 22 reacts with the solder material 4 to form $Cu_6Sn_5$. As a result, as shown in FIG. 2, the $Cu_6Sn_5$ portion 4b is deposited on the surface of the Ni layer 2a. In the related art, even when the metal plate 2 and the semiconductor element 6 are joined to each other through the Sn-0.7Cu solder, $Cu_6Sn_5$ is not deposited on the surface of the Ni layer 2a. On the other hand, in the embodiment, the Cu layer 22 is formed on the surface of the Ni layer 2a, and the solder material 4 is melted and solidified in a state where the solder material 4 is in contact with the Cu layer 22. The Cu layer 22 may be the $Cu_6Sn_5$ material. Accordingly, although the solder material (Sn-0.7Cu solder) having a low proportion of Cu is used, the $Cu_6Sn_5$ portion 4b can be formed during the solidification of the solder material. As described above, the total weight of copper is 2.0 wt % with respect to the total weight of the joining materials. When the total weight of copper is 2.0 wt % with respect to the total weight of the joining materials, the $Cu_6Sn_5$ portion 4b can be reliably formed.

In the embodiment, the entire region of the Cu layer 22 is removed by joining the semiconductor element 6 to the metal plate 2. Therefore, as shown in FIG. 3, a configuration in which the Ni layer 2a and the $Cu_6Sn_5$ portion 4b are in direct contact with each other is obtained. By removing the entire region of the Cu layer 22, the Ni layer 2a and the $Cu_6Sn_5$ portion 4b are partially not in contact with each other. That is, the $Cu_6Sn_5$ portion 4b includes: the contact portion 18a that is in contact with the Ni layer 2a; and the non-contact portion 18b that is not in contact with the Ni layer 2a. In the non-contact portion 18b, voids are formed between the $Cu_6Sn_5$ portion 4b and the Ni layer 2a. However, the voids are surrounded by the Ni layer 2a and the $Cu_6Sn_5$ portion 4b and are not connected to the solder portion 4a. Therefore, mutual diffusion between the solder portion 4a and the Ni layer 2a is prevented.

Figure 5:
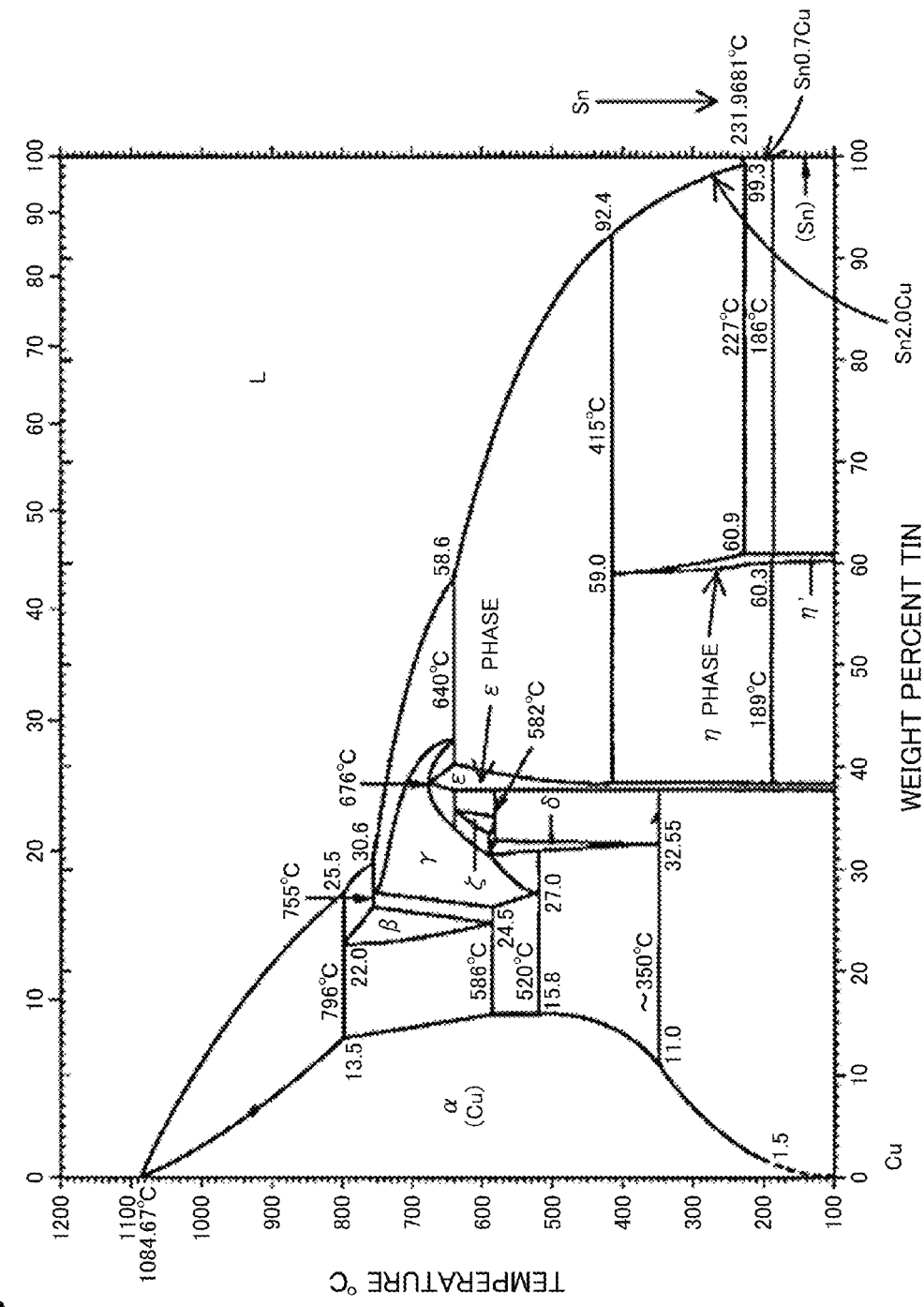
FIG. 5 is a Cu—Sn binary phase diagram.
Figure 6:
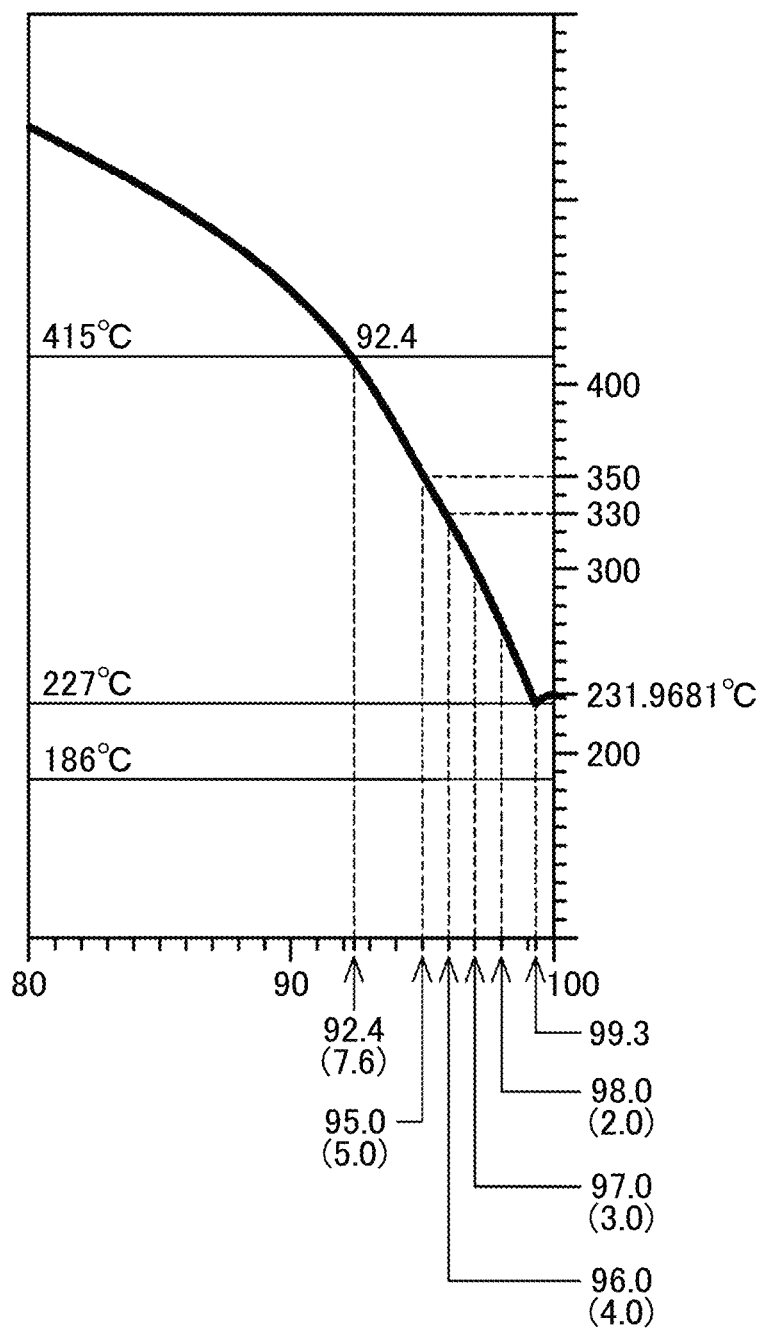
FIG. 6 is an enlarged view showing a part (Sn: 80 to 100) of FIG. 5.

As described above, by providing the Cu layer 22 on the surface of the Ni layer 2a, the proportion of Cu contained in the solder material 4 as an alloy is suppressed to be low at 0.7 wt %. By suppressing the proportion of Cu contained in the solder material, the melting point (or liquidus temperature) of the solder material can be reduced. As shown in FIGS. 5 and 6, the melting point of the Sn-0.7Cu solder is 227° C., which is lower than the liquidus temperature of a Sn-2.0Cu solder (270° C. to 280° C.). In the method according to the embodiment, when the semiconductor element 6 and the metal plate 2 are joined to each other, without providing the Cu layer 22, the temperature applied to the semiconductor element 6 can be reduced to be lower than that of a case where Sn-2.0Cu solder is used for the joining. Therefore, with the method according to the embodiment, the temperature applied to the semiconductor element 6 in the soldering step can be reduced.

As in the metal plate 2, in the metal plate 10, Ni is electroplated on the surface of the Cu plate. In the spacer 14, Ni is electroplated on both surfaces (front surface and back surface) of the Cu plate. In addition, a Ni film is formed on the surface of the electrode 6b. The joint portion between the electrode 6b and the spacer 14 and the joint portion between the spacer 14 and the metal plate 10 have substantially the same structure as the joint portion between the semiconductor element 6 and the metal plate 2. Therefore, the description of the interface between the semiconductor element 6 and the joining layer 16, the interface between the spacer 14 and the joining layer 16, the interface between the spacer 14 and the joining layer 12, and the interface between the metal plate 10 and the joining layer 12 will be replaced with the description of the interface between the metal plate 2 and the joining layer 4.

The advantageous effects of the semiconductor device 100 will be described. As described above, the $Cu_6Sn_5$ portion 4b is provided between the solder portion 4a and the Ni layer 2a. Therefore, the $Cu_6Sn_5$ portion 4b functions as a barrier layer. Therefore, even when heat is generated from the semiconductor element 6, mutual diffusion between tin of the solder portion 4a and nickel of the Ni layer 2a can be suppressed. By the $Cu_6Sn_5$ portion 4b being provided, the formation of a compound of tin and nickel on the interface between the semiconductor element 6 and the metal plate 2 can be suppressed. By forming a compound of tin and nickel on the interface between the semiconductor element 6 and the metal plate 2, the semiconductor device is heated and cooled. Accordingly, the modification of the Ni layer 2a progresses. When the modification of the Ni layer 2a reaches the Cu plate 2b, the metal plate 2 may be peeled off from the semiconductor element 6. Since the $Cu_6Sn_5$ portion 4b is present between the solder portion 4a and the Ni layer 2a, such peeling can be prevented. Further, in the semiconductor device 100, the Cu layer 22 is provided on the surface of the Ni layer 2a. As a result, the $Cu_6Sn_5$ portion 4b can be formed using the solder material having a low proportion of Cu. Therefore, the temperature applied to the semiconductor element 6 in the soldering step can be reduced.

Figure 7:
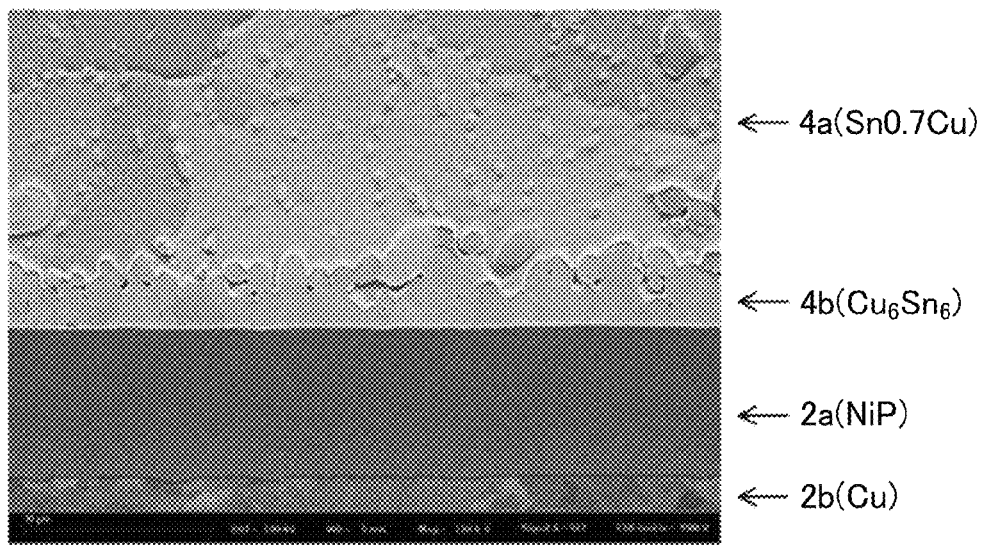
FIG. 7 is a SEM image showing a joint interface between a semiconductor element and a joined member in a semiconductor device of Example 1.
Figure 8:
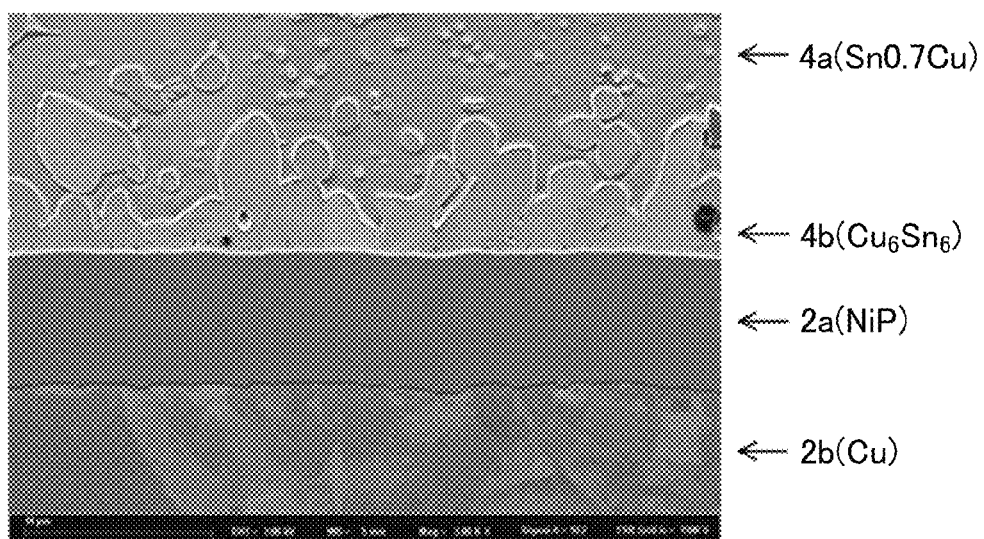
FIG. 8 is a SEM image showing the joint interface between the semiconductor element and the joined member after the semiconductor device of Example 1 was repeatedly heated.
Figure 9:
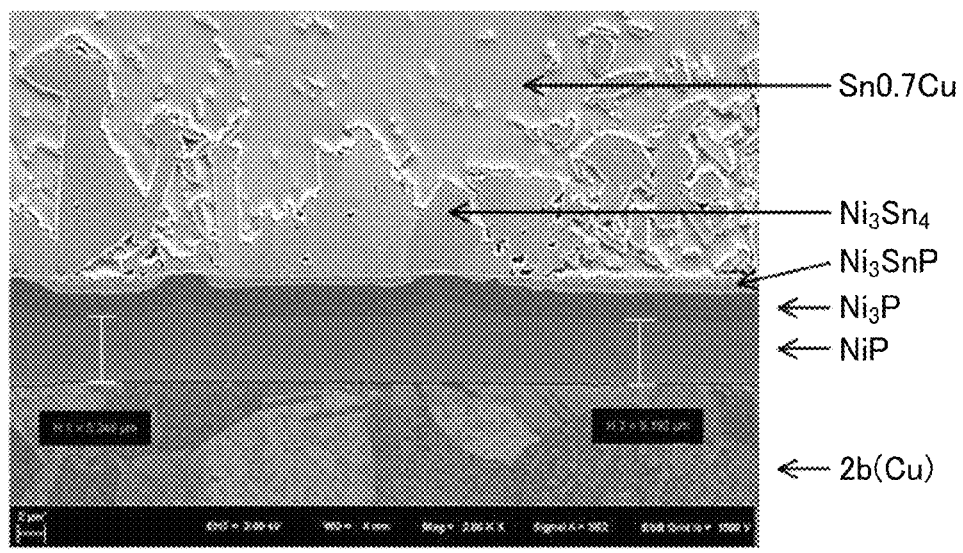
FIG. 9 is a SEM image showing a joint interface between a semiconductor element and a joined member in a semiconductor device of Comparative Example 1.
Figure 10:
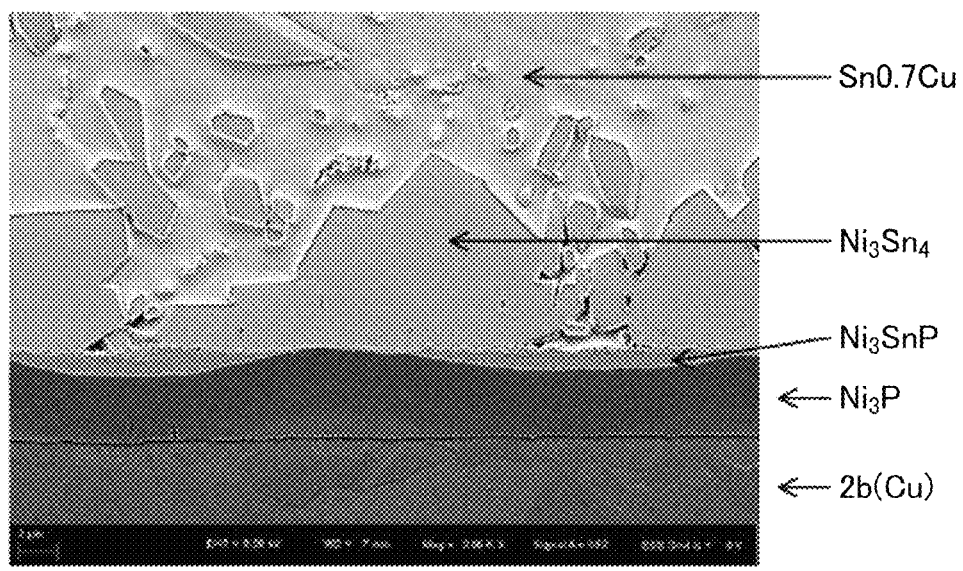
FIG. 10 is a SEM image showing the joint interface between the semiconductor element and the joined member after the semiconductor device of Comparative Example 1 was repeatedly heated.

Referring to FIGS. 7 to 10, characteristics of a semiconductor device of Example 1 will be described. FIGS. 7 and 8 show the examination results of the semiconductor device of Example 1. FIGS. 9 and 10 show the examination results of a semiconductor device of Comparative Example 1. Each of FIGS. 7 to 10 shows a SEM image of a joint interface between a solder portion and a metal plate when a semiconductor element was joined to a metal plate.

In Example 1, a Ni layer (NiP) having a thickness of 7.0 μm as a metal plate was formed on a surface of a Cu plate by electroless-plating the surface of the Cu plate with nickel, and a Cu layer having a thickness of 1.4 μm was formed by sputtering on a surface of the Ni layer. As a solder material, Sn-0.7Cu solder having a thickness of 0.15 mm was used. FIG. 7 shows a joint interface between the solder portion 4a and the Cu plate 2b after arranging the solder material between the semiconductor element and the metal plate, heating the solder material to 230° C., and cooling the solder material to room temperature. FIG. 8 shows the joint interface between the solder portion 4a and the Cu plate 2b after performing 4 cycles of a heat treatment in which a step of heating the solder portion 4a of FIG. 7 to 230° C. and cooling the solder portion 4a to room temperature was set as one cycle.

In Comparative Example 1, a Ni layer (NiP) having a thickness of 7.0 μm as a metal plate was formed on a surface of a Cu plate by electroless-plating the surface of the Cu plate with nickel. As a solder material, as in the case of Example 1, Sn-0.7Cu solder having a thickness of 0.15 mm was used. That is, Example 1 is different from Comparative Example 1, in that the Cu layer was formed on the surface of the Ni layer. FIG. 9 shows a joint interface between a solder portion and the Cu plate 2b after arranging the solder material between the semiconductor element and the metal plate, heating the solder material to 230° C., and cooling the solder material to room temperature. FIG. 10 shows the joint interface between the solder portion and the Cu plate 2b after performing 4 cycles of a heat treatment in which a step of heating the solder portion of FIG. 9 to 230° C. and cooling the solder portion 4a to room temperature was set as one cycle.

As shown in FIG. 7, in Example 1, the $Cu_6Sn_5$ portion 4b was formed between the Ni layer 2a and the solder portion 4a. As shown in FIG. 8, even when the heat treatment was repeatedly performed, the $Cu_6Sn_5$ portion 4b functioned as a barrier layer so as to prevent Sn of the solder portion from being diffused to the Ni layer 2a.

On the other hand, as shown in FIG. 9, in Comparative Example 1, not the $Cu_6Sn_5$ portion 4b but a $Ni_3Sn_4$ layer and a $Ni_3SnP$ layer were formed between the Ni layer 2a and the solder portion 4a. $Ni_3P$ was modified on the surface of the Ni layer (NiP). Further, as shown in FIG. 10, when the heat treatment was repeatedly performed four times, $Ni_3P$ grew, and substantially the entire region of the Ni layer (NiP) was modified to $Ni_3P$. When $Ni_3P$ reaches the Cu plate 2b, the Cu plate 2b may be peeled off from the solder portion 4a.

In Example 1 and Comparative Example 1, since the solder materials were the same (Sn-0.7Cu solder), the melting points of the solder materials were the same. As shown in FIG. 9, in Comparative Example 1, a $Cu_6Sn_5$ layer was not formed between the Ni layer and the solder portion. This result shows that, when the proportion of Cu constituting the solder material is low (0.7 wt %), a $Cu_6Sn_5$ layer is not formed. On the other hand, in Example 1, although the solder material was the same as that of Comparative Example 1, the $Cu_6Sn_5$ portion 4b was formed between the Ni layer and the solder portion. By forming the copper layer on the surface of the Ni layer, the $Cu_6Sn_5$ portion was able to be formed on the surface of the Ni layer without an increase in the temperature during the joining between the semiconductor element and the metal plate.

In the above-described embodiment, the thickness of the Cu layer 22 is adjusted to be 1.4 μm, and the thickness of the solder material 4 (Sn-0.7Cu solder) is adjusted to be 0.15 mm. As a result, the total weight of copper is adjusted to be 2.0 wt % with respect to the total weight of the joining materials. However, for example, a Sn solder (Sn 100%) may be used as a solder material. When a Sn solder is used, the total weight of copper can be adjusted to be 2.0 wt % with respect to the total weight of the joining materials by adjusting the thickness of the Cu layer to be 2.5 μm. In this case, the melting point of the Sn solder is 232° C., which is lower than the liquidus temperature (270° C. to 280° C.) of Sn-2.0Cu solder. The total weight of copper may be higher than 2.0 wt % with respect to the total weight of the joining materials. In this case, the thickness of the Cu layer may be increased. The thickness of the Cu layer can be calculated according to the thickness of the solder material, the proportion of Cu contained in the solder material, and the desired proportion of Cu with respect to the total weight of the joining materials.

In the above-described embodiment, voids are formed between the $Cu_6Sn_5$ portion 4b and the Ni layer 2a due to the non-contact portion 18b which is not in contact with the Ni layer 2a. However, copper may be present between the non-contact portion 18b and the Ni layer 2a. Copper may be a residue of the Cu layer 22 provided on the surface of the Ni layer 2a.

In the above-described embodiment, the copper layer 22 is provided on the surface of the Ni layer 2a, and the Ni layer and the copper layer are further provided on the surface of the electrode 6a of the semiconductor element 6. Therefore, a configuration in which $Cu_6Sn_5$ was formed on the surface of the Ni layer was obtained in the region (refer to FIG. 1) between the electrode 6b and the solder portion 4. In this case, the sum of the weight of copper contained in the solder material, the weight of copper contained in the copper layer 22, and the weight of copper contained in the copper layer on the surface of the electrode 6a may be 2 wt % or higher with respect to the total weight of the joining materials (including the weight of the copper layer on the surface of the electrode 6a). The copper layer 22 may be provided on the surface of the Ni layer 2a only in the metal plate 2 without providing the Ni layer and the copper layer on the surface of the electrode 6a.

Similarly, in the description of the above-described embodiment, in the semiconductor device, each of the electrodes 6a, 6b of the semiconductor element 6, the metal plates 2, 10, and the spacer 14 includes a Cu portion (Cu plate) and a Ni film which covers a surface of the Cu portion. However, the semiconductor device may have a structure in which at least one of the electrodes 6a, 6b, the metal plates 2, 10, and the spacer 14 includes a Cu portion and a Ni film which covers a surface of the Cu portion. In a semiconductor device, the risk of defects in joint portions caused by heat varies depending on the heating conditions and the environmental temperature during the manufacturing steps, the heat generation from the semiconductor element, and the like. In the semiconductor device 100, defects are likely to occur due to heat in the portions that are in direct contact with the semiconductor element 6. That is, in the semiconductor device 100, defects are likely to occur in the joint portion between the metal plate 2 and the semiconductor element 6 and the joint portion between the semiconductor element 6 and the spacer 14. In particular, defects are likely to occur in the joint portion between the semiconductor element 6 and the spacer 14. The technique relating to the joining layer (the solder portion containing elemental copper in base metal, and the $Cu_6Sn_5$ portion in contact with the nickel layer) disclosed in this specification may be applied to only the above-described portions where defects are likely to occur.

Some technical characteristics of the semiconductor device and the method of manufacturing a semiconductor device disclosed in this specification will be described. The following features have individual technical significance.

The semiconductor device may include: a semiconductor element; a joined member on which a Ni layer is provided; and a joining layer through which the joined member is joined. The joining layer includes a solder portion and a $Cu_6Sn_5$ portion. The solder portion may contain at least tin. The $Cu_6Sn_5$ portion may be provided between the Ni layer and the solder portion. A portion of the $Cu_6Sn_5$ portion may be in contact with the surface of the Ni layer, and other portions of the $Cu_6Sn_5$ portion may not be in contact with the surface of the Ni layer. The proportion of Cu contained in the joining layer may be 2.0 wt % or higher. The weight of copper contained in the solder portion may be lower than 0.9 wt % with respect to the weight of the solder portion.

The method of manufacturing a semiconductor device in which the semiconductor element and the joined member are joined to each other includes the arrangement step and the heat treatment step. In the arrangement step, the solder material may be arranged between the semiconductor element and the joined member. The Ni layer may be provided on the surface of the joined member, and the copper layer may be provided on at least a portion of the surface of the Ni layer. The solder material may contain at least tin. In the arrangement step, the solder material may be in contact with the copper layer. In the heat treatment step, the solder material may be melted and solidified. In the heat treatment step, $Cu_6Sn_5$ may be formed on the surface of the Ni layer due to tin in the solder material and the copper layer. The sum (total weight of copper) of the weight of copper contained in the solder material and the weight of copper in a region in contact with the solder material in the arrangement step may be 2.0 wt % or higher with respect to the sum (total weight of the joining materials) of the weight of the solder material and the weight of copper in the region in contact with the solder material.

The Ni layer and the copper layer may be formed on the surface of the joined member before the arrangement step. The Ni layer may be electroplated on the surface of the joined member. Alternatively, the Ni layer may be electroless-plated on the surface of the joined member. The Ni layer may be formed by sputtering on the surface of the joined member. Similarly, the copper layer may be electroplated or electroless-plated on the surface of the Ni layer. The copper layer may be formed by sputtering on the surface of the Ni layer.

The material of the solder portion in the joining layer may be the same as the material of the solder material through which the semiconductor element and the joined member are joined to each other. The proportion of tin in the solder material may be 100% (tin solder). The solder material may be Sn—Cu solder containing copper. When the solder material is Sn—Cu solder, the proportion of copper constituting the solder material may be 0.3 wt % or higher and is preferably 0.5 wt % or higher. It is more preferable that the solder material is Sn-0.7Cu (Cu content ratio: 0.7%). As clearly seen from FIGS. 5 and 6, in Sn-0.3Cu solder, Sn-0.5Cu solder, and Sn-0.7Cu solder, an η (eta) phase compound ($Cu_6Sn_5$) is formed during phase transformation from the liquid phase to the solid phase. The proportion of copper contained in the Sn—Cu solder is adjusted to be 0.3 wt % or higher. As a result, even when there is a variation in the thickness of the copper layer provided on the Ni layer, the $Cu_6Sn_5$ portion can be reliably formed. By adjusting the proportion of copper to be 0.5 wt % or higher, the $Cu_6Sn_5$ portion can be more reliably formed. Among the Sn—Cu solders, Sn-0.7Cu solder has the lowest melting point. From the viewpoint of suppressing exposure of the semiconductor element to a high temperature in the joining step, it is more preferable the solder material is Sn0.7Cu solder (Cu content ratio: 0.7%). In addition, "Sn—Cu solder" is a general term for alloys containing tin and copper as major components and may further contain, for example, Ni, P (phosphorus), Bi (bismuth), Sb (antimony), or Ag (silver) in addition to tin and copper.

The proportion of copper constituting the solder material may be 7.6 wt % or lower and is preferably 5.0 wt % or lower and more preferably 4.0 wt % or lower. As shown in FIGS. 5 and 6, when the Cu content ratio in the Sn—Cu solder is higher than 7.6 wt %, an ε (epsilon) phase compound ($Cu_3Sn$) is formed during phase transformation of the base metal from the liquid phase to the solid phase. On the other hand, when the Cu content ratio is 7.6 wt % or lower, an η (eta) phase compound ($Cu_6Sn_5$) is formed during phase transformation of the base metal from the liquid phase to the solid phase. Therefore, when the total weight of copper is higher than 7.6 wt % with respect to the total weight of the joining materials, not $Cu_6Sn_5$ but $Cu_3Sn$ is formed. By adjusting the proportion of the total weight of copper to be 7.6 wt % or lower, the $Cu_6Sn_5$ portion can be reliably formed. From the viewpoint of providing the copper layer on the surface of the Ni layer and reliably forming the $Cu_6Sn_5$ portion, the proportion of copper constituting the solder material is preferably lower than 7.6 wt %.

As shown in FIG. 6, the Sn—Cu solder (Sn-5.0Cu solder) in which the proportion of copper constituting the solder material is 5.0 wt % has a melting point of 350° C. An element protective film used for a semiconductor element may deteriorate at a temperature higher than 350° C. Therefore, when the proportion of copper constituting the solder material is higher than 5.0 wt %, it is necessary to take countermeasures to suppress deterioration of the element protective film. By adjusting the proportion of copper constituting the solder material to be 5.0 wt % or lower, deterioration of the element protective film can be suppressed without taking any special countermeasures.

As shown in FIG. 6, the Sn—Cu solder (Sn-4.0Cu solder) in which the proportion of copper constituting the solder material is 4.0 wt % has a melting point of 330° C. An electrode used in a semiconductor element may crack at a temperature of higher than 330° C. depending on the material thereof. Therefore, when the proportion of copper constituting the solder material is higher than 4.0 wt %, it is necessary to take countermeasures for preventing the cracking of an electrode. For example, it is necessary to limit the material of an electrode. By adjusting the proportion of copper constituting the solder material to be 4.0 wt % or lower, a semiconductor device in which the cracking of an electrode is suppressed can be obtained without taking any special countermeasures.

The total weight of copper may be 2.0 wt % or higher and is more preferably 3.0 wt % or higher with respect to the total weight of the joining materials. As clearly seen from FIGS. 5 and 6, in Sn-2.0Cu solder, an η (eta) phase compound ($Cu_6Sn_5$) is formed during phase transformation from the liquid phase to the solid phase. That is, by adjusting the total weight of copper to be 2.0 wt % or higher, the $Cu_6Sn_5$ portion can be reliably formed on the surface of the Ni layer. By adjusting the total weight of copper to be 3.0 wt % or higher, the $Cu_6Sn_5$ portion can be more stably formed on the surface of the Ni layer. The thickness of the copper layer (weight of the copper layer) may be adjusted according to the proportion of Cu contained in the solder material.

Hereinabove, specific examples of the invention have been described in detail. However, these examples are merely exemplary and do not limit the claims. The technique described in the claims includes various modifications and alternations of the above-described specific examples. The technical features described in this specification and the drawings exhibit technical significance when being used alone or in a combination thereof, and are not limited to the combinations described in the claims at the time of filing of the application. The technique exemplified in this specification or the drawings simultaneously achieves plural objects, and the technical significance is obtained by achieving one of the objects.

What is claimed is:

1. A method of manufacturing a semiconductor device comprising:
    arranging a solder material containing at least tin, between a semiconductor element and a joined member provided with a nickel layer and a copper layer, such that the solder material is in contact with the copper layer, the nickel layer being provided on a surface of the joined member, and the copper layer being provided on at least a portion of a surface of the nickel layer; and
    melting and solidifying the solder material to form $Cu_6Sn_5$ on the surface of the nickel layer using tin of the solder material and the copper layer,
    wherein
        a sum of a weight of copper contained in the solder material and a weight of copper in a region in contact with the solder material is 2,0 wt % or higher with respect to a sum of a weight of the solder material and a weight of copper in the region in contact with the solder material.

2. The method of manufacturing a semiconductor device according to claim 1 wherein
    a sum of a weight of copper contained in the solder material and a weight of copper in a region in contact with the solder material is 7.6 wt % or lower with respect to a sum of a weight of the solder material and a weight of copper in the region in contact with the solder material.

3. The method of manufacturing a semiconductor device according to claim 1 wherein
    the solder material contains copper.

4. The method of manufacturing a semiconductor device according to claim 3, wherein
    the solder material is an alloy containing Sn-0.7Cu as a major component.

5. A semiconductor device comprising:
    a semiconductor element;
    a joined member on which a nickel layer is provided; and
    a joining layer through which the joined member is joined to the semiconductor element, wherein
    the joining layer includes a solder portion and a $Cu_6Sn_5$ portion, the solder portion containing at least tin, and the $Cu_6Sn_5$ portion being provided between the nickel layer and the solder portion,
    the $Cu_6Sn_5$ portion is in contact with a portion of a surface of the nickel layer and is not in contact with other portions of the surface of the nickel layer, and
    a proportion of copper contained in the joining layer is 2.0 wt % or higher.

6. A semiconductor device comprising:
    a semiconductor element;
    a joined member on which a nickel layer is provided; and
    a joining layer through which the joined member is joined to the semiconductor element, wherein
    the joining layer includes a solder portion and a $Cu_6Sn_5$ portion, the solder portion containing tin and copper, and the $Cu_6Sn_5$ portion being provided between the nickel layer and the solder portion, and
    a weight of copper contained in the solder portion is lower than 0.9 wt % with respect to a weight of the solder portion.

7. A method of manufacturing a semiconductor device comprising:
    arranging a solder material containing at least tin, between a semiconductor element and a joined member provided with a nickel layer and a copper layer, such that the solder material is in contact with the copper layer, the nickel layer being provided on a surface of the joined member, and the copper layer being provided on at least a portion of a surface of the nickel layer; and
    melting and solidifying the solder material to form $Cu_6Sn_5$ on the surface of the nickel layer using tin of the solder material and the copper layer,
    wherein
        a sum of a weight of copper contained in the solder material and a weight of copper in a region in contact with the solder material is 7.6 wt % or lower with respect to a sum of a weight of the solder material and a weight of copper in the region in contact with the solder material.

* * * * *